United States Patent [19]

Welty

[11] Patent Number: 4,814,056

[45] Date of Patent: Mar. 21, 1989

[54] APPARATUS FOR PRODUCING GRADED-COMPOSITION COATINGS

[75] Inventor: Richard P. Welty, Boulder, Colo.

[73] Assignee: Vac-Tec Systems, Inc., Boulder, Colo.

[21] Appl. No.: 66,254

[22] Filed: Jun. 23, 1987

[51] Int. Cl.⁴ ............................................. C23C 14/00
[52] U.S. Cl. .............................. 204/298; 204/192.12; 427/282; 427/255.5; 118/720; 118/729; 118/733
[58] Field of Search ............... 118/720, 721, 730, 729, 118/733, 301; 427/282, 255.5, 258, 425, 255.7; 204/298, 192.12

[56] References Cited

U.S. PATENT DOCUMENTS

| | | |
|---|---|---|
| 3,170,810 | 2/1965 | Kagan . |
| 3,327,683 | 6/1967 | Kerecman ............................ 118/720 |
| 3,335,030 | 8/1967 | Vercesi et al. . |
| 3,561,993 | 2/1971 | Geffcken . |
| 3,573,960 | 4/1971 | Duncan . |
| 3,664,948 | 5/1972 | Graffeo, Jr. et al. . |
| 3,775,285 | 11/1973 | Lane . |
| 3,904,503 | 9/1975 | Hanfmann . |
| 3,933,644 | 1/1976 | Skinner et al. . |
| 3,968,018 | 7/1976 | Lane et al. ................. 204/192.12 X |
| 3,985,635 | 10/1976 | Adam et al. ......................... 204/298 |
| 4,047,624 | 9/1977 | Dorenbos ....................... 118/733 X |
| 4,102,768 | 7/1978 | Kearin et al. . |
| 4,151,064 | 4/1979 | Kuehnle ............................. 204/298 |
| 4,184,448 | 1/1980 | Aichert et al. ...................... 118/729 |
| 4,204,942 | 5/1980 | Chahroudi ................. 204/192.12 X |
| 4,303,489 | 12/1981 | Morrison, Jr. . |
| 4,473,455 | 9/1984 | Dean et al. ......................... 204/298 |
| 4,581,245 | 4/1986 | Nakamura et al. .......... 427/255.7 X |
| 4,682,565 | 7/1987 | Carrico .......................... 118/729 X |
| 4,692,233 | 9/1987 | Casey ........................ 204/192.12 X |

Primary Examiner—Shrive Beck
Assistant Examiner—Alain Bashore
Attorney, Agent, or Firm—Gerald J. Ferguson, Jr.

[57] ABSTRACT

Apparatus for depositing a coating on at least one substrate where the coating includes at least two component materials where the relative percentages of the component materials with respect to each other varies through the thickness of the coating. The apparatus includes at least two deposition sources for respectively providing the two component materials, at least one mask having at least one aperture, the mask being disposed between at least one of said two deposition sources and the substrate, and a motion effecting mechanism for effecting relative motion between the substrate and the deposition sources to thus effect a predetermined variation of the relative percentages of the component materials as a function of at least the shape of the aperture in the mask.

28 Claims, 7 Drawing Sheets

APPARATUS FOR PRODUCING GRADED-COMPOSITION COATINGS

BACKGROUND AND PRIOR ART

This invention relates to the deposition of a coating on a substrate by such vacuum techniques as sputtering, thermal evaporation, and arc evaporation and, in particular to the deposition of such coatings comprising two or more components in which the relative percentages of the components change through the coating thickness.

Figure 7:
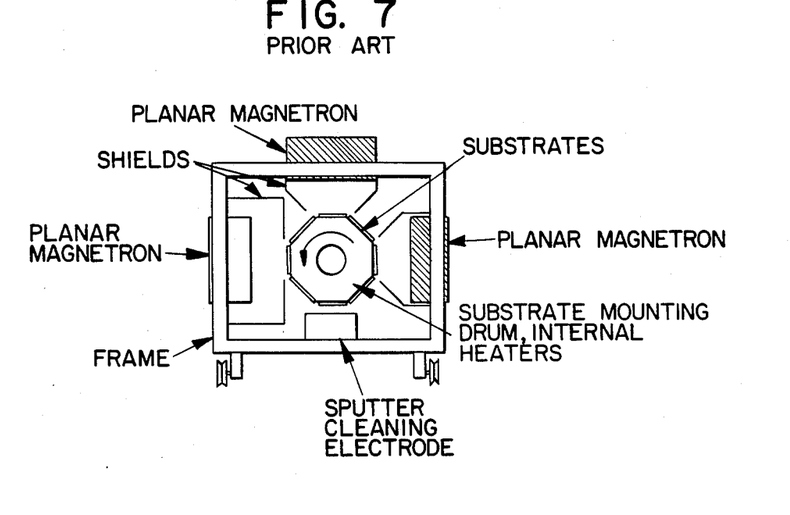
FIGS. 7 and 8 are schematic illustrations of prior art apparatus for producing graded composition coatings.

In a publication by Thornton and Lamb, Thin Solid Films, 96(1982) pp. 175-183, there is disclosed a multi-source deposition configuration utilized in a vacuum chamber, see FIG. 7 of the present application. In particular, two or more cathodes are mounted facing a rotating substrate (or array of substrates), with the power to one or more of the cathodes being changed as a function of time during the deposition process, so as to change the deposition rate of one material, and therefore change the composition of the coating as its thickness increases. The power may be increased or decreased so as to produce an arbitrary composition profile. This is effected with the only motion of the substrate being rotation, there being no provision to translate the substrates through the chamber during the deposition process. The shields indicated serve to improve the deposition rate uniformity along the length of the cathode and do not influence the grading of the coating composition.

Figure 8:
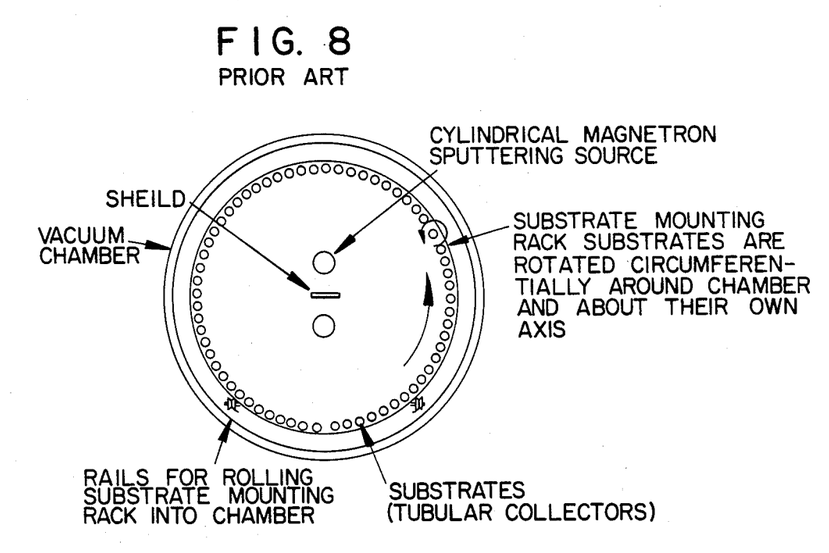

In a further publication by Thornton and Lamb, Final Report to Solar Energy Research Institute, Contract No. XP-9-8260-1, December 1982, a similar technique to that of FIG. 7 is described in which multiple substrates are coated in a single batch as illustrated in FIG. 8. In particular, $Pt/Al_2O_3$ graded cermet coatings are deposited on tubular substrates.

As will be described hereinafter, masking techniques are advantageously employed in the present invention utilizing one or more shaped aperture shields. Such shields have also been used in the prior art with respect to obtaining coatings of a single layer or multiple discrete layers so exemplified by such patents as U.S. Pat. Nos. 3,170,810; 3,335,030; 3,561,993; 3,573,960; 3,664,948; 3,775,285; 3,904,503; 3,933,644; 4,102,768; and 4,303,489 (all of which are incorporated herein by reference), copies of which are submitted herewith, where the coatings may be varied in shape and/or thickness. However, none of these patents are directed to obtaining a composite coating of the type obtained with the present invention where the relative percentages of the components change through the thickness of each layer of one or more layers.

SUMMARY OF THE INVENTION

A primary object of the invention is to provide an improved apparatus utilizing a mask having a shaped aperture for depositing a coating consisting of two or more components in which the relative percentage of each component changes through the thickness of the coating.

It is a further object to deposit the film while substrates move sequentially along a linear path through the deposition system, so as to make possible high volume production of coated objects.

It is a further object to provide the above composite films by such vacuum coating techniques as sputtering, thermal evaporation, or cathodic arc evaporation.

Another object of this invention is to provide shaped aperture shield(s) whereby substrates can be moved "tip to tail" through the deposition zone, so that the deposition process can occur continuously on an unbroken stream of substrates, which are gated in and out of a deposition chamber through vacuum locks at each end. The main advantage of this configuration, as compared to the batch approach of prior art, is the possibility of higher production rates for coated substrates. The production rate is generally higher in a continuous throughput system since it is not necessary to switch off the deposition sources while unloading, reloading, and pumping the substrates to high vacuum, as it is in a batch system.

DETAILED DESCRIPTION OF PREFERRED EMBODIMENT

Figure 1:
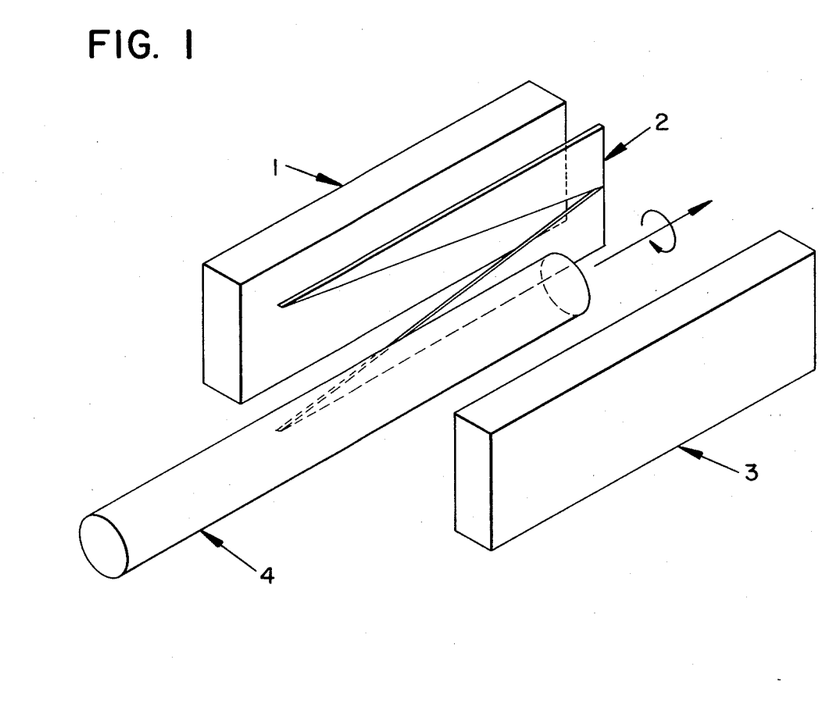
FIG. 1 is a schematic illustration of a preferred embodiment of the invention to control relative percentages of deposited materials with respect to coating thickness.

With reference to the drawings and particularly to FIG. 1, there is illustrated a schematic preferred embodiment of the invention.

A rod/tube 4 may be the substrate upon which two component materials are deposited in controlled relative percentages from one end of the rod to the other. Sources 1 and 3 are positioned on opposite sides of the substrate. The sources 1 and 3 may be any known source such as a rectangular planar sputtering cathode as illustrated or a cathodic arc source, thermal evaporation source, etc. The sources do not form a part of the invention per se except as utilized in the improved apparatus.

In accordance with the present invention a mask 2 is interposed between source 1 and the substrate, the mask including an aperture, the width of which varies linearly in FIG. 1 and which may, in general, vary in any desired non-linear manner.

In the process and apparatus illustrated in FIG. 1, the substrate rotates about its axis, as shown by the arrow as the substrate is translated in the direction shown by the other arrow. A non-rotational substrate and rotating sources may also be employed.

As the substrate moves past the sources 1 and 3, and mask 2, the material from source 1 deposited at a particular point on the substrate decreases until the point reaches the end of the aperture in the mask. In particular, the composition of the coating at any point on the substrate will be such that, when the point is adjacent the open end of the aperture, the amount of material deposited from source 1 is equal to the amount of material from source 3, assuming all other factor are equal such as the power respectively applied to the sources. At any intermediate position between the ends of the aperture, the percentage of material deposited on a given point of the substrate from source 1 will decrease from 50% to zero percent of the total amount of material deposited from both source 1 and source 3. Thus at the terminal end of the aperture, the material deposited at any point on the substrate will be entirely that from source 3. Hence, at the base of the coating formed on the substrate, the composition will be 50% source 1 material and 50% source 3 material while at the top of the coating it will be 100% source 3 material, the grading profile between the base and top of the coating being uniformly linear along the length of the substrate.

An illustrative use of the FIG. 1 embodiment might be the deposition of a graded cermet solar absorbing coating on a long solar collector tube, in which it is desired to have the composition of the coating taper uniformly from 50/50% Ceramic/Metal at its base at 100% Ceramic at the top, with the grading profile to be uniform along the length of the pipe. This is effected by the two or more deposition sources 1 and 3 mounted around the perimeter of substrate 4 which translates past the sources and rotates around its axis of translation. Aperture shield 2 partially shades the substrate from source 1, where the width of the aperture and hence the amount of shading changes along the direction of translation of the substrate. The aperture is mounted between metal source 1 and the substrate, the shape of the aperture being such that the amount of metal deposited as a function of distance along the source decreases linearly in the direction of travel. The ceramic source 3 is mounted on the opposite side of the substrate, with no aperture shield, so that the amount of ceramic deposited as a function of distance along the source is constant. The result of this configuration is that, as the substrate translates along the source length while rotating, each point on the substrate surface is coated with alternating layers of metal and ceramic, with the thickness of the metal layers decreasing linearly with distance along the sources, while the thickness of the ceramic layers remains constant. The rotation speed of the substrate may be controlled to produce whatever layer thickness, and therefore degree of mixing, is desired. The substrate temperature or electrical bias may also be controlled to influence interdiffusion of the layers, although this is not per se part of the present invention.

Figure 2:
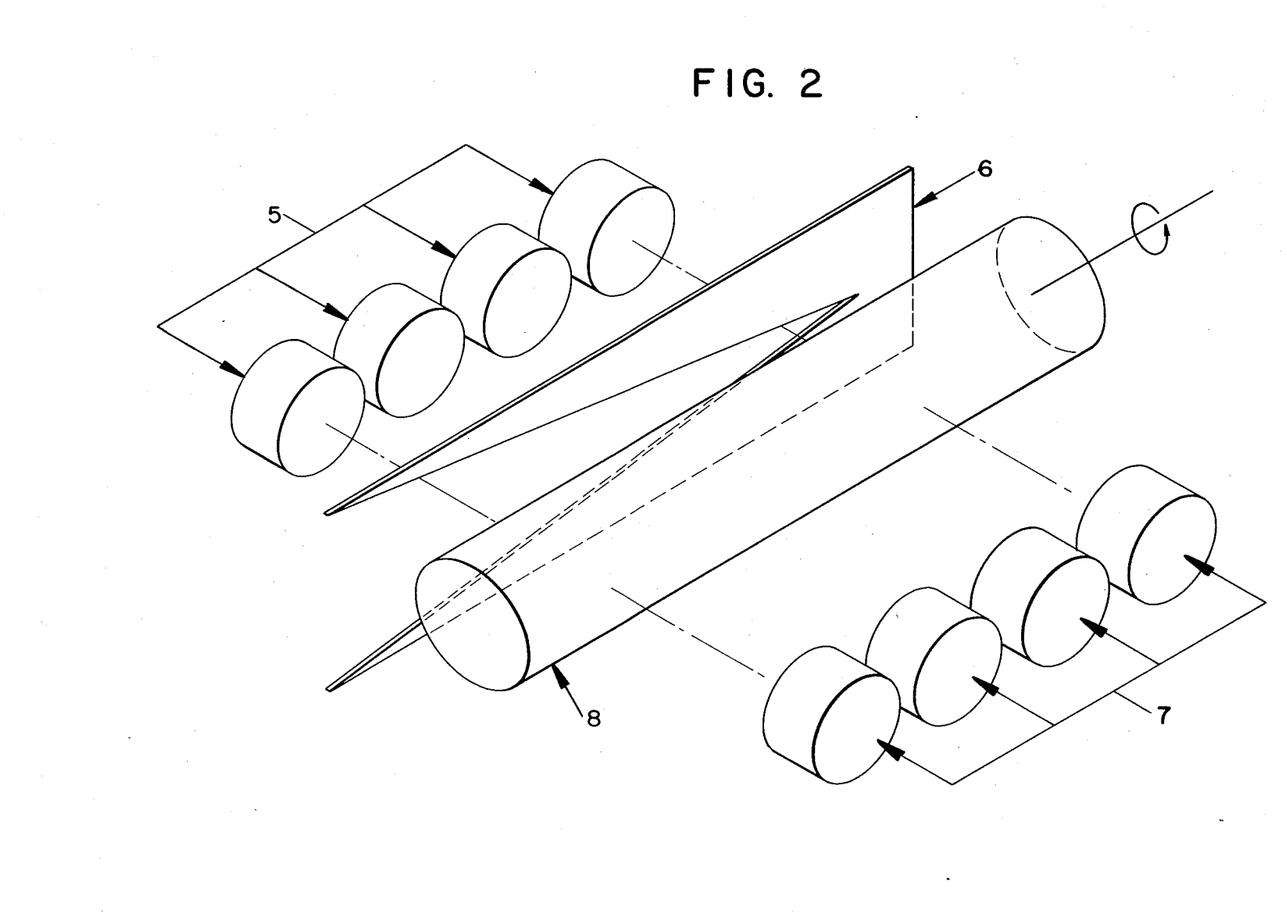
FIG. 2 is similar to the apparatus of FIG. 1 where multiple sources are employed.

In FIG. 2 the process is similar to that shown in FIG. 1 but modified to provide multiple sources 5 and 7 on opposite sides of the substrate. Thus, there are multiple sources 5 and 7 for each material where the sources are arranged in linear arrays (one array for each material) along the direction of travel of the substrate 8 and where one or more aperture shields 6 is mounted between one or more of the arrays and the substrate, so as to effect a graded composition profile as described above with respect to FIG. 1.

The power of each source in at least one of the linear arrays of FIG. 2 may be varied as a function of distance along the direction of travel of the substrate, so as to vary the deposition rate of at least one of the materials as a function of distance along the direction of travel. Aperture shields may or may not be used in this case, but are preferred in order to control the composition profile more accurately than can be done using power variations alone.

Figure 3:
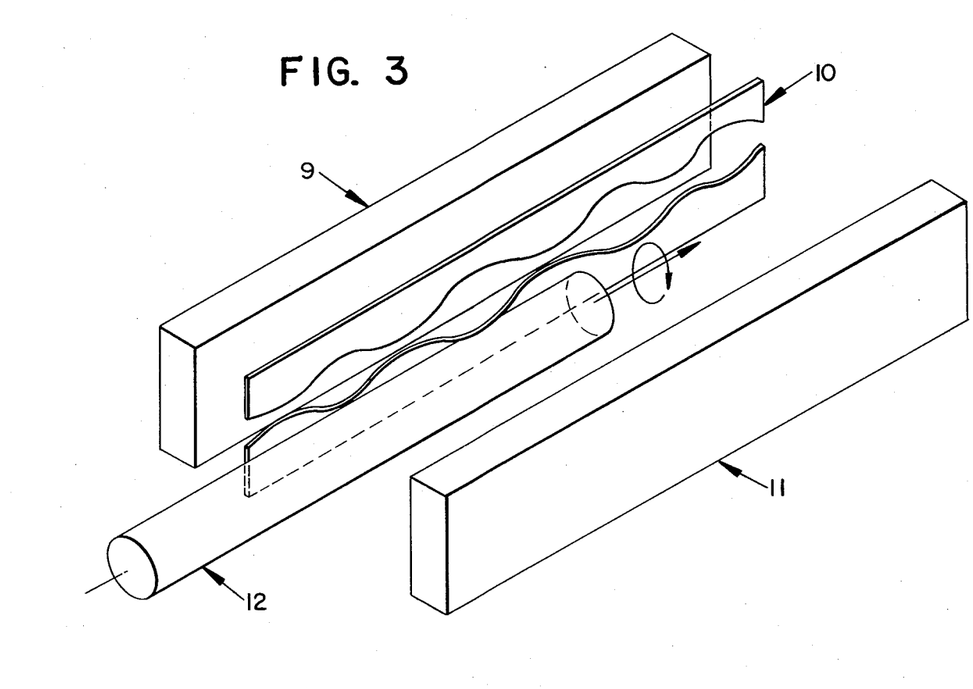
FIG. 3 illustrates the apparatus of FIG. 1 utilizing a non-linear aperture to provide a non-linear variation in relative percentages of the component materials.

In FIG. 3 the operation and apparatus of the improved process is again the same as FIG. 1. The primary distinction in the embodiment of FIG. 3 is that the aperture(s) may be shaped such that the amount of material deposited through the aperture may increase or decrease along the length of the source 9 in a linear or non-linear manner, or may be modulated so as to increase and decrease in an oscillatory manner along the length of the source/array. Coatings may be produced in this manner in which the composition profile varies in any specified manner as a function of position between the base and the top of the coating, as the substrate 12 travels through the deposition zone.

Figure 4:
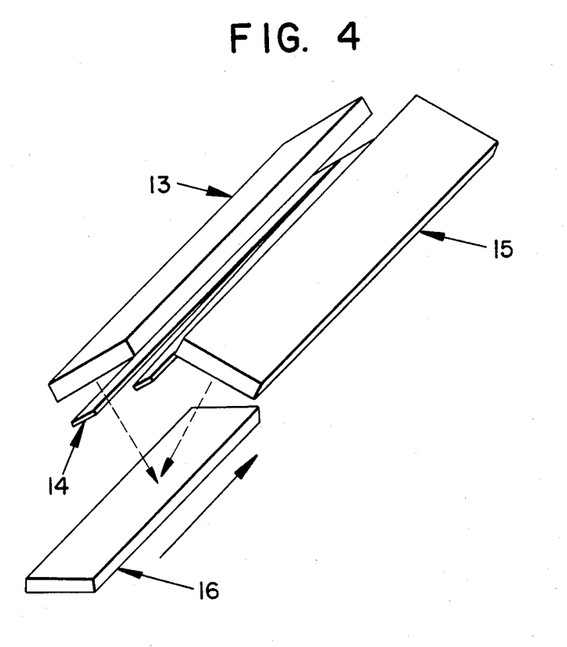
FIG. 4 illustrates an alternative positioning of the sources relative to the substrate particularly adaptable to a flat substrate.

In FIG. 4 a substrate 16 is coated which may have a flat deposition surface. The sources/arrays 13, 15 may be mounted on the same side of substrate 16 which translated along the length of the sources, and which may or may not rotate, and in which the sources are both pointing so as to deposit material simultaneously in a given region on the substrate surface. One or more of the sources may be equipped with a shaped aperture 14 to effect the grading of the coating along the direction of translation. The width of the object which can be coated in a non-rotating mode will be limited by the variation in composition across the width of the substrate, as determined by side-to-side deposition distribution of the sources.

Figure 5:
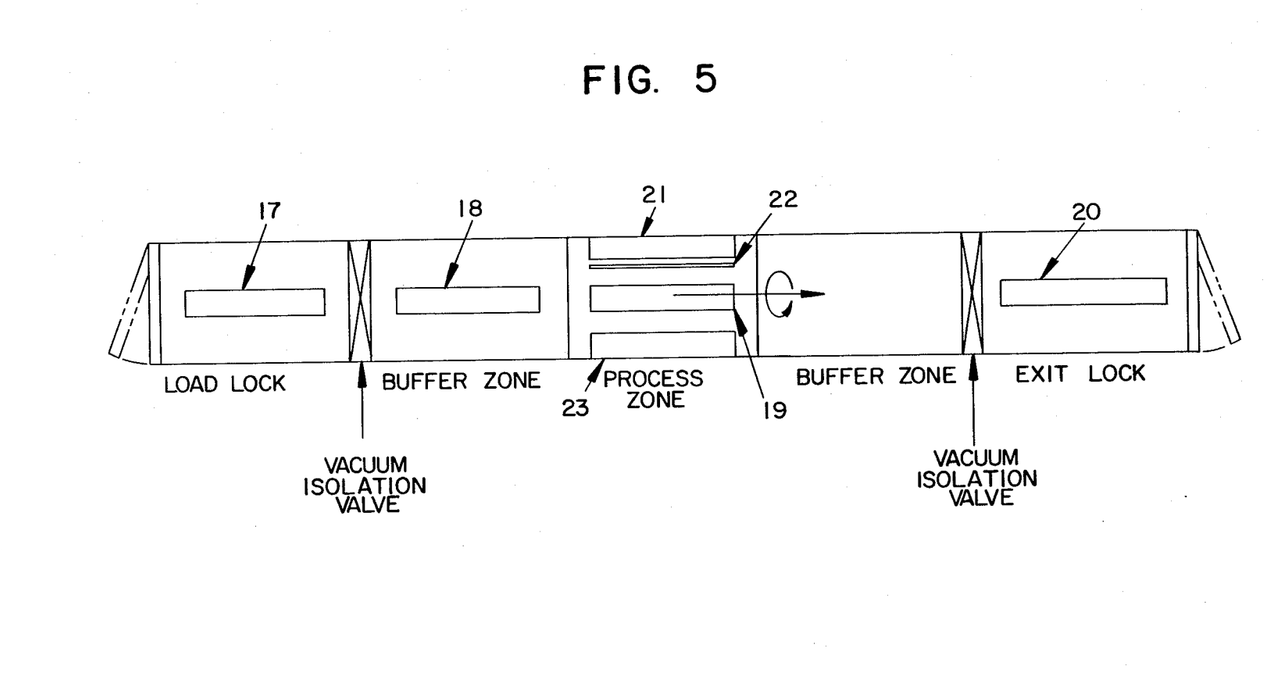
FIG. 5 also illustrates the apparatus of FIG. 1 adapted to coat a multiple number of substrates in a continuous in-line process.

In FIG. 5, the sources 21, 23 and aperture shield(s) 22 are contained in a vacuum process chamber, with vacuum-isolated load locks at each end of the substrate travel, so that substrates 17–20 may be sequentially fed into the load lock and removed from the exit lock, such that a continuous (or intermitent) stream of substrates passes through the deposition zone (this being known in the industry as an "inline" system). It is understood that as many deposition zones as desired may be disposed end-to-end in order to form multi-layer coatings, in which each layer may be of single or multiple (graded or non-graded) components.

Figure 6:
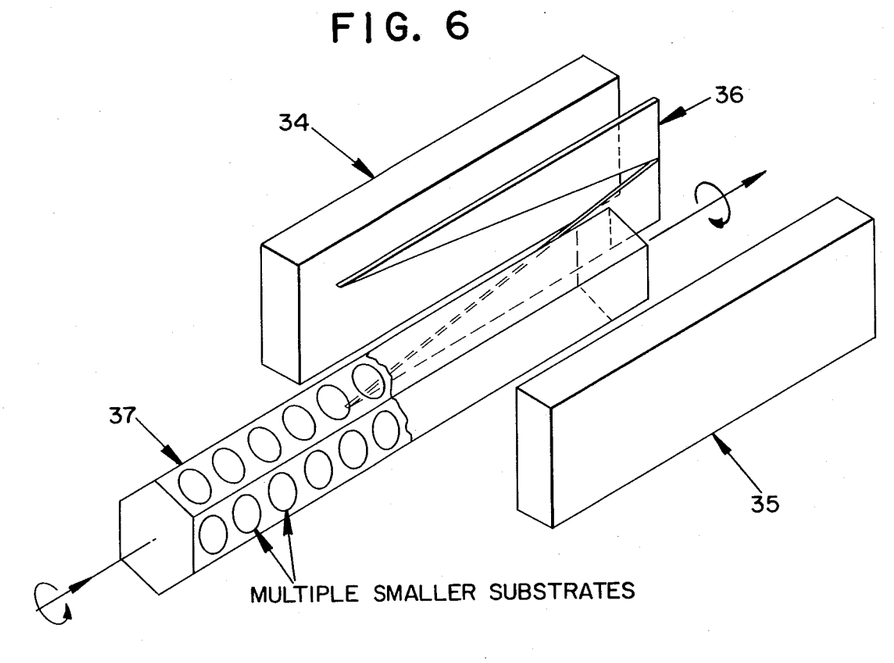
FIG. 6 illustrates the improved process of the present invention where smaller substrates mounted on a larger carrier are coated.

In FIG. 6, smaller substrates are mounted onto a larger carrier 37 which translates and which may or may not rotate, and in which the substrates themselves may or may not rotate. In the case of a rotating carrier, the carrier diameter may be as large as desired in order to allow as many substrates as desired to be mounted around the periphery. It is understood that the carrier need not be cylindrical, but may have, for example, multiple flat sides for the mounting of substrates, or may have a planar area for the mounting of substrates. The sources 34 and 35 and mask 36 may correspond to those employed in the previous embodiments.

What is claimed is:

1. Apparatus for depositing at least one graded composition coating on a surface of at least one substrate where the graded coating includes at least two component materials where the relative percentages of the component materials with respect to each other varies through the thickness of the coating, said apparatus comprising:

at least two deposition sources for respectively providing said two component materials;

at least one mask having at least one aperture, said mask being disposed between at least one of said two deposition sources and said substrate; and motion effecting means for effecting relative motion betweeen said substrate and said deposition sources where the width of the aperature varies in a direction substantially parallel to said relative motion between the substrate and the deposition sources to thus effect a predetermined variation of said relative percentages of said component materials as a function of at least the shape of the aperture in the mask such that the composition of the graded coating is uniform over the surface of the substrate.

2. Apparatus as in claim 1 where the aperture in the mask linearly varies in size in the direction of relative motion of the substrate with respect to the mask so that the amount of material deposited from said one source linearly varies through the thickness of the coating.

3. Apparatus as in claim 1 where the aperture in the mask non-linearly varies in size in the direction of relative motion of the substrate with respect to the mask so that the amount of material deposited from said one source non-linearly varies through the thickness of the coating.

4. Apparatus as in claim 1 where the aperture in the mask varies in size in accordance with a predetermined periodicity in the direction of relative motion of the substrate with respect to the mask so that the amount of material deposited from said one source varies with said periodicity through the thickness of the coating.

5. Apparatus as in claim 1 where said mask is disposed only between said one deposition source and said substrate so that the amount of component material deposited from the other deposition source remains constant through the coating thickness.

6. Apparatus as in claim 1 where said deposition sources are so positioned with respect to the substrate that they respectively deposit the component materials on different areas on the surface of the substrate.

7. Apparatus as in claim 1 where said deposition sources are so positioned with respect to the substrate that they respectively deposit the component materials on areas on the surface of the substrate which at least partially overlap.

8. Apparatus as in claim 1 including means for applying electrical power to said deposition sources including means for varying the powers respectively applied to the sources to thus facilitate said predetermined variation of said relative percentages of said component materials.

9. Apparatus as in claim 1 where each of said deposition sources includes a plurality of sources substantially aligned in the direction of relative motion of the substrate with respect to the plurality of sources.

10. Apparatus as in claim 1 where said deposition sources are stationary and said substrate moves with respect to the deposition sources.

11. Apparatus as in claim 1 including at least one load lock, at least on process chamber in which is included said deposition sources and said mask, at least one exit lock, and means for sequentially feeding the substrate through the load lock, the process chamber, and the exit lock.

12. Apparatus as in claim 11 including a plurality of process chambers for forming a multi-layer coating where the layers are respectively formed in said process chambers.

13. Apparatus as in claim 12 where each layer may be of single or multiple (graded or non-graded) component materials.

14. Apparatus as in claim 1 where said substrate is cylindrical in configuration and said motion effecting means includes means for translating the substrate along its axis by the deposition sources.

15. Apparatus as in claim 14 where said motion effecting means includes means for rotating said cylindrical substrate about its axis.

16. Apparatus as in claim 15 where said deposition sources are so disposed with respect to said substrate that they deposit their respective component materials on different portions of the substrate.

17. Apparatus as in claim 16 where said deposition sources are respectively disposed on substantially opposite sides of the substrate.

18. Apparatus as in claim 14 where said one coating material is metallic and the other is ceramic.

19. Apparatus as in claim 1 wherein said substrate includes a substantially flat deposition surface upon which the coating is deposited.

20. Apparatus as in claim 19 where said deposition sources are so positioned with respect to said flat deposition surface that the respective component materials provided by these sources substantially overlap on the flat deposition surface.

21. Apparatus as in claim 1 including a plurality of substrates mounted on a substrate carrier.

22. Apparatus as in claim 21 where said motion effecting means includes means for translating the substrate carrier by the deposition sources.

23. Apparatus as in claim 22 where said motion effecting means includes means for rotating the substrates with respect to the carrier.

24. Apparatus as in claim 22 where said motion effecting means includes means for rotating the substrate carrier.

25. Apparatus as in claim 1 where said deposition sources are selected from the group consisting of cathodic arc devices, sputtering devices, and thermal evaporation devices.

26. An apparatus for depositing at least one graded composition coating on a surface of at least one substrate where the graded coating includes at least two component materials where the relative percentages of the component materials with respect to each other varies through the thickness of the coating, said apparatus comprising:

means for directing said two component toward said substrate;

means including an aperture for intercepting a portion of at least one of said two component materials prior to said portion reaching the substrate; and means for relatively moving the substrate with respect to the component materials being deposited thereon where the width of the aperture varies in a direction substantially parallel to said relative movement of the substrate with respect to the component materials being deposited thereon to thus effect a predetermined variation of said relative percentage of said component materials as a function of at least said intercepted portion of said one component material such that the composition of the graded coating is uniform over the surface of the substrate.

27. Apparatus for depositing a coating on at least one substrate where the coating includes at least two component materials where the relative percentages of the component materials with respect to each other varies through the thickness of the coating, said apparatus comprising:

- at least two deposition sources for respectively providing said two component materials;
- at least one mask having at least one aperture, said mask being disposed between at least one of said two deposition sources and said substrate; and
- motion effecting means for effecting relative motion between said substrate and said deposition sources where the aperture in the mask linearly varies in size in the direction of relative motion of the substrate with respect to the mask so that the amount of material deposited from said one source linearly varies through the thickness of the coating such that the composition of the graded coating is uniform over the surface of the substrate.

28. Apparatus for depositing a coating on at least one substrate where the coating includes at least two component materials where the relative percentages of the component materials with respect to each other varies through the thickness of the coating, said apparatus comprising:

- at least two deposition sources for respectively providing said two component materials;
- at least one mask having at least one aperture, said mask being disposed between at least one of said two deposition sources and said substrate; and
- motion effecting means for effecting relative motion between said substrate and said deposition sources where the aperture in the mask non-linearly varies in size in the direction of relative motion of the substrate with respect to the mask so that the amount of material deposited from said one source non-linearly varies through the thickness of the coating such that the composition of the graded coating is uniform over the surface of the substrate.

* * * * *